(12) United States Patent
Yamamoto et al.

(10) Patent No.: US 7,814,796 B2
(45) Date of Patent: Oct. 19, 2010

(54) PARTIAL PRESSURE MEASURING METHOD AND PARTIAL PRESSURE MEASURING APPARATUS

(75) Inventors: Masahiro Yamamoto, Osaka (JP); Takeshi Koiwasaki, Osaka (JP); Hitoshi Yamanishi, Osaka (JP); Isao Muragishi, Osaka (JP); Mitsuhiro Yoshinaga, Osaka (JP)

(73) Assignee: Panasonic Corporation, Osaka (JP)

( * ) Notice: Subject to any disclaimer, the term of this patent is extended or adjusted under 35 U.S.C. 154(b) by 362 days.

(21) Appl. No.: 12/103,763

(22) Filed: Apr. 16, 2008

(65) Prior Publication Data

US 2008/0257014 A1    Oct. 23, 2008

(30) Foreign Application Priority Data

Apr. 18, 2007  (JP) .............................. 2007-108968

(51) Int. Cl.
*G01L 9/00* (2006.01)
(52) U.S. Cl. .......................................... 73/705; 216/60
(58) Field of Classification Search ........................ None
See application file for complete search history.

(56) References Cited

U.S. PATENT DOCUMENTS

| | | | |
|---|---|---|---|
| 4,243,506 A | 1/1981 | Ikeda et al. | |
| 4,394,237 A | 7/1983 | Donnelly et al. | |
| 5,290,383 A | 3/1994 | Koshimizu | |
| 5,464,667 A | 11/1995 | Kohler et al. | |
| 5,863,339 A | 1/1999 | Usami | |
| 5,871,658 A | 2/1999 | Tao et al. | |
| 5,980,767 A | 11/1999 | Koshimizu et al. | |
| 5,998,931 A | 12/1999 | Donohoe | |
| 6,117,348 A * | 9/2000 | Peng et al. ..................... 216/60 |
| 6,908,529 B2 * | 6/2005 | Yamamoto et al. ..... 156/345.24 |
| 7,022,937 B2 * | 4/2006 | Okumura et al. ....... 219/121.56 |

FOREIGN PATENT DOCUMENTS

| | | |
|---|---|---|
| JP | 58-46640 | 3/1983 |
| JP | 2-25249 | 6/1990 |
| JP | 5-62944 | 3/1993 |
| JP | 5-315095 | 11/1993 |
| JP | 11-236666 | 8/1999 |
| JP | 2005-276618 | 10/2005 |
| JP | 2006-313847 | 11/2006 |

\* cited by examiner

*Primary Examiner*—Lisa M Caputo
*Assistant Examiner*—Jermaine Jenkins
(74) *Attorney, Agent, or Firm*—Wenderoth, Lind & Ponack, L.L.P.

(57) ABSTRACT

Provided is a partial pressure measuring method and a partial pressure measuring apparatus by which a partial pressure distribution is easily measured in a vacuum chamber. The partial pressure measuring method and the partial pressure measuring apparatus includes: moving a local plasma source dedicated to partial pressure measuring provided in the vacuum chamber, to a location at which the measuring is to be performed; and measuring a partial pressure distribution in the vacuum chamber, by receiving emission of plasma generated by the local plasma source through a window which is formed in a wall part of the vacuum chamber and through which the emission passes, and thereby performing emission spectral analysis on intensity of the emission.

16 Claims, 7 Drawing Sheets

PARTIAL PRESSURE MEASURING METHOD AND PARTIAL PRESSURE MEASURING APPARATUS

BACKGROUND OF THE INVENTION (1) Field of the Invention

The present invention relates to partial pressure measuring methods and partial pressure measuring apparatuses, and more particularly to a partial pressure measuring method and a partial pressure measuring apparatus for measuring partial pressure in a vacuum chamber.

(2) Description of the Related Art

For mass production process of various products such as electronic components and optical thin films, surface modification for introducing a small amount of gas into a vacuum chamber thereby causing reaction on a substrate surface; dry etching for processing a surface by generating plasma; sputtering for forming a film; Chemical Vapor Deposition (CVD); and the like have been widely used.

In order to perform homogeneous processing on the substrate surface, it is desirable that concentration of the small amount of gas is homogeneous in the vacuum chamber. Therefore, it is vital to know concentration distribution of the small amount of gas in the vacuum chamber and also control the concentration of the small amount of gas.

One example of such processing is sputtering by which a film is formed on a substrate by generating plasma in a vacuum. Reactive sputtering is one of methods for forming oxide or nitride as a film at a high speed using sputtering. By the reactive sputtering, a DC voltage is applied to a metal target in a vacuum chamber to generate plasma. Thereby, atoms sputtered from the metal target by the generated plasma are reacted with reactive gas introduced into the vacuum chamber. As a result, oxide or nitride is deposited on a substrate.

In order to obtain homogeneous composition of the compound thin film formed in the vacuum chamber, it is crucial to control distribution of the introduced gas to achieve homogeneous reaction. Therefore, gas partial pressure distribution in an apparatus which actually forms the compound thin film should be monitored and controlled. Here, regarding definition of the partial pressure, a pressure of certain gas among whole pressure of mix gas is called partial pressure of the certain gas. The partial pressure distribution means distribution of spatial partial pressure in a vacuum chamber.

One of conventional methods for measuring partial pressure distribution uses a mass analyzer, for example.

In the partial pressure distribution measuring method using a mass spectrometer, gas has to be brought to reach an analyzer tube of the mass analyzer. Therefore, when local partial pressure in a vacuum chamber is measured, it is necessary to set a pipe to reach a measuring location in the vacuum chamber. Furthermore, radius of the pipe should be short. However, if the radius of the pipe is shortened, conductance of the pipe is lowered, which fails to measure the partial pressure correctly. In addition, adsorption gas adhered to a surface of the pipe affects the measuring.

In order to address the above problem, it is known, from Japanese translation of PCT international application No. 02-25249, for example, to provide a method using a spectroscopic measuring apparatus, as a partial pressure measuring method without setting a pipe in a vacuum chamber.

In this technology, a spectroscopic analysis using a Laser Induced Fluorescene (LIF) is disclosed. The spectroscopic analysis using LIF can measure partial pressure at each location irradiated by laser.

Figure 1:
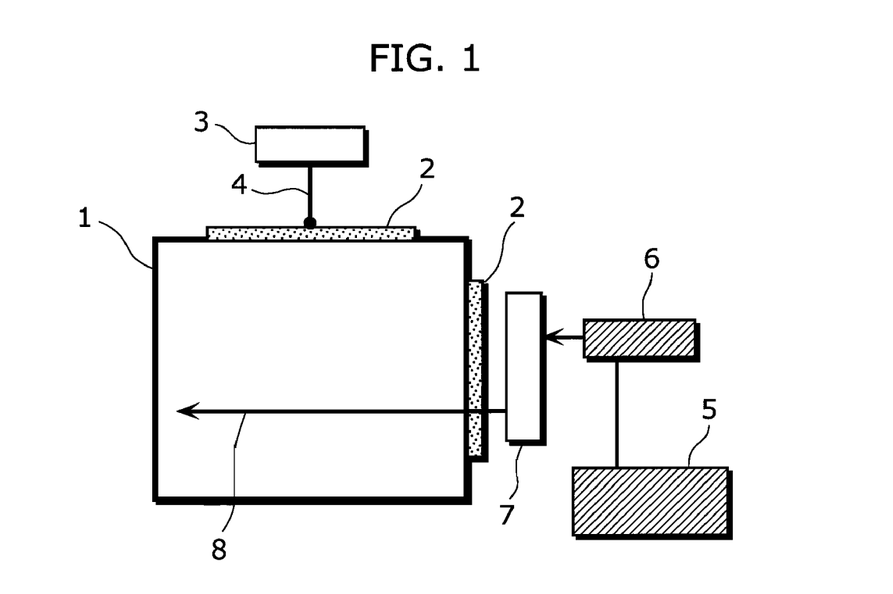
FIG. 1 is a block diagram of the conventional partial pressure measuring apparatus.

FIG. 1 is a schematic block diagram of a conventional spectroscopic measuring apparatus. The spectroscopic measuring apparatus of FIG. 1 includes a vacuum chamber 1, a transparent window 2, a spectroscope 3, an optical fiber 4, a laser-oscillation power source 5, a laser unit 6, and laser-control optical unit 7.

In the spectroscopic measuring apparatus of FIG. 1, the transparent window 2 is formed on an external wall of the vacuum chamber 1, and laser 8 provided from outside by the laser unit 6 is irradiated to gas in the vacuum chamber 1. The irradiation of the laser 8 to the gas causes light emission when molecules of the gas are excited and back to the ground state. Partial pressure distribution at each location can be determined by measuring the intensity of the caused emission along a path of the laser 8.

However, the conventional spectroscopic measuring apparatus is generally quite expensive and requires a long time for the measuring since emission intensity is low. If the measuring is performed in a shorter time, noise is increased thereby reducing an accuracy of the measuring.

In addition, the conventional spectroscopic measuring apparatus has another problem. In the conventional spectroscopic measuring apparatus, every time of measuring each location in the vacuum chamber 1, optical systems such as the laser unit 6 and the spectroscope 3 need to be moved and adjusted. Therefore, mass production process is quite difficult to be introduced.

A number of solutions have been proposed to address the problem of the spectroscopic measuring apparatuses. Partial pressure measuring methods for reducing inconvenience of adjustment of optical systems and cost are disclosed in Japanese translation of PCT international application No. 02-25249, Japanese Unexamined Patent Application Publications Nos. 11-23666, 5-62944, and 58-46640, and Japanese translation of PCT international application No. 2005-276618, for example.

The Japanese Unexamined Patent Application Publication No. 11-23666 discloses a partial pressure measuring method of measuring partial pressure of $H_2O$ in a vacuum chamber by detecting plasma emission spectrum.

The Japanese Unexamined Patent Application Publication No. 05-62944 discloses a method of focusing plasma emission generated in a vacuum camber into a spectroscope, and then performing spectral analyzing of the plasma emission.

The Japanese Unexamined Patent Application Publication No 58-46640 discloses a method of performing spectral analysis on plasma emitted from a window formed on a vacuum chamber.

However, in the above-described technologies, the measuring is performed by using a part of plasma emission generated by a plasma source for process provided in the vacuum chamber (hereinafter, referred to as "process plasma source"). Therefore, intensity of such plasma emission generated by a process plasma source is relatively high, so that plasma emission regarding gas to be measured is not always measured accurately. In short, the above-described partial pressure measuring methods disclosed in these publications utilize plasma emission of a process plasma source provided in a vacuum chamber, thereby receiving not only plasma emission regarding gas to be measured but also plasma emission regarding gas not to be measured. As a result, the above-described partial pressure measuring methods have difficulty of achieving correct partial pressure measuring for target gas.

In the meanwhile, the Japanese translation of PCT international application No. 2005-276618 discloses that the process plasma source provided in a vacuum chamber is configured as a cylinder electrode. Such a process plasma source as a cylinder electrode restricts an angle and a position where plasma emission generated by the process plasma source can be received. Furthermore, the process plasma source disclosed in the Japanese translation of PCT international application No. 2005-276618 is movable, so that it is difficult to adjust the receiving and the measuring of plasma emission generated by the process plasma source. Therefore, this partial pressure measuring method also fails to perform correct partial pressure measurement for target gas in a vacuum chamber.

SUMMARY OF THE INVENTION

The present invention overcomes the problems of the conventional technologies as described above. It is an object of the present invention to provide a partial pressure measuring method and a partial pressure measuring apparatus by which partial pressure distribution in a vacuum chamber can be easily measured.

In accordance with an aspect of the present invention for achieving the object, there is provided a partial pressure measuring method including: moving a local plasma source to a location at which partial pressure is to be measured, the local plasma source being provided in a vacuum chamber and dedicated to the partial pressure measuring; and measuring a partial pressure distribution in the vacuum chamber, by (i) receiving, through a window, emission of plasma generated by the local plasma source and (ii) performing emission spectral analysis on intensity of the emission, the window being provided in a wall part of the vacuum chamber and through the window the emission passing.

By the above method, it is possible to use emission of plasma generated by a local plasma source dedicated to the partial pressure measurement, not emission of plasma generated by a process plasma source used for processing. As a result, it is possible to easily measure pressure distribution in a vacuum chamber. In addition, since the local plasma source can move, plasma can be generated at a desired position in the vacuum chamber. As a result, it is possible to realize local partial pressure measurement at a desired position.

It is also possible that a partial pressure measuring method includes measuring a partial pressure distribution at plurality of locations in a vacuum chamber, by (i) receiving, through a window, emission of plasma generated by each of a plurality of local plasma sources in the vacuum chamber and (ii) performing emission spectral analysis on intensity of the emission regarding each of the plurality of local plasma sources, the window being provided in a wall part of the vacuum chamber and through the window the emission passing.

By the above method, it is possible to emission of plasma generated by the plurality of local plasma sources each dedicated to the partial pressure measurement, not emission of plasma generated by a process plasma source used for processing. As a result, it is possible to easily measure pressure distribution at a plurality of locations in the vacuum chamber.

The local plasma source may have an electrode which is one of a DC parallel plate electrode, a high-frequency parallel plate electrode, an inductively coupled plasma coil electrode, and a mesh opposite electrode.

By the above method, the local plasma source does not block gas flow in the vacuum chamber. As a result, the partial pressure measurement can be performed at high accuracy.

The local plasma source may have: a surface which is substantively in a floating state; and a metal surface facing the surface.

The partial pressure measuring method may be performed in the vacuum chamber in a processing apparatus which includes in the vacuum chamber: a process plasma source used for processing performed in the processing apparatus; and a substrate which is to be processed in the processing apparatus, and the partial pressure measuring method may further include performing adjustment based on the partial pressure distribution measured in the measuring, so that a distribution of the intensity of the emission regarding each of the plurality of local plasma sources becomes homogeneous in the vacuum chamber, wherein the adjusting may include physically forming a thin film on the substrate, by using another plasma generated by applying a high voltage to the process plasma source. The processing apparatus may be a sputtering apparatus which has a target as a plasma source in the vacuum chamber and forms a thin film on the substrate by using another plasma generated by applying a high voltage to the target, and in the adjusting, at least one of a gas flow volume, a gas mix ratio, a target application power, and a pressure control valve opening degree may be adjusted based on the partial pressure distribution measured in the measuring, so that a distribution of the intensity of is the emission becomes homogeneous in the vacuum chamber.

By the above method, the pressure distribution in the vacuum chamber of a processing apparatus can be easily measured, and based on the measurement result, film-forming parameter can be adjusted. Thereby, it is possible to form a film homogeneously.

In accordance with another aspect of the present invention for achieving the object, there is provided a partial pressure measuring apparatus includes: a local plasma source which is provided in a vacuum chamber and dedicated to partial pressure measuring; a moving unit operable to move the local plasma source to a location at which the partial pressure is to be measured; a window which is formed in a wall part of the vacuum chamber and through which the emission passes; and a measurement unit operable to measure a partial pressure distribution in the vacuum chamber, by (i) receiving, through the window, emission of plasma generated by the local plasma source and (ii) performing emission spectral analysis on intensity of the emission.

By the above structure, the partial pressure measuring apparatus according to the present invention can use emission of plasma generated by the local plasma source dedicated to the measurement, not emission of plasma generated by a process plasma source used for processing. As a result, the partial pressure measuring apparatus according to the present invention can easily measure pressure distribution in the vacuum chamber.

It is also possible that a partial pressure measuring apparatus includes: a plurality of local plasma sources which are provided in a vacuum chamber and dedicated to partial pressure measuring; a window which is formed in a wall part of the vacuum chamber and through which the emission passes; and a measurement unit operable to measure a partial pressure distribution in the vacuum chamber, by (i) receiving, through the window, emission of plasma generated by each of the plurality of local plasma sources and (ii) performing emission spectral analysis on intensity of the emission regarding each of the plurality of local plasma sources.

By the above structure, the partial pressure measuring apparatus according to the present invention can use emission of plasma generated by the plurality of local plasma sources dedicated to the measurement, not emission of plasma generated by a process plasma source used for processing. As a result, the partial pressure measuring apparatus according to the present invention can easily measure pressure distribution at a plurality of locations in the vacuum chamber.

The local plasma source has an electrode which is one of a DC parallel plate electrode, a high-frequency parallel plate electrode, an inductively coupled plasma coil electrode, and a mesh opposite electrode.

The local plasma source may have an electrode which is one of a DC parallel plate electrode, a high-frequency parallel plate electrode, an inductively coupled plasma coil electrode, and a mesh opposite electrode.

By the above structure, the local plasma source does not block gas flow in the vacuum chamber. As a result, the partial pressure measuring apparatus according to the present invention can perform the partial pressure measurement at high accuracy.

The local plasma source may have: a surface which is substantively in a floating state; and a metal surface facing the surface.

The partial pressure measuring apparatus may be included in a processing apparatus which has in the vacuum chamber: a process plasma source used for processing performed in the processing apparatus; and a substrate which is to be processed in the processing apparatus, the manufacturing apparatus performs adjustment based on the partial pressure distribution measured by the measuring unit, so that a distribution of the intensity of the emission becomes homogeneous in the vacuum chamber, and forms physically a thin film on the substrate, by using another plasma generated by applying a high voltage to the process plasma source. The processing apparatus may be a sputtering apparatus which has a target as a plasma source in the vacuum chamber and forms a thin film on the substrate by using another plasma generated by applying a high voltage to the target, and adjust at least one of a gas flow volume, a gas mix ratio, a target application power, and a pressure control valve opening degree, based on the partial pressure distribution measured by the measurement unit, so that a distribution of the intensity of the emission becomes homogeneous in the vacuum chamber.

By the above structure, the pressure distribution in the vacuum chamber of a processing apparatus can be easily measured, and based on the measurement result, film-forming parameter can be adjusted. Thereby, the partial pressure measuring apparatus according to the present invention can form a film homogeneously.

The local plasma source may have an electrode which is a punching metal electrode having at least one small hole for causing glow discharge.

By the above structure, the partial pressure measuring apparatus according to the present invention can realize the local plasma source at low cost.

The local plasma source may have an electrode which is a hollow cathode electrode.

By the above structure, plasma can be generated without a power source dedicated to a local plasma source. As a result, the partial pressure measuring apparatus according to the present invention can realize the local plasma source at low cost.

Furthermore, in the partial pressure measuring method according to the present invention, it is also possible to measure partial pressure distribution at plurality of locations in the vacuum chamber, by (i) receiving emission from a local plasma source dedicated to partial pressure measurement provided in the vacuum chamber, through a window which is formed on a wall of the vacuum chamber and through which the emission passes, and (ii) perform emission spectral analysis on intensity of the emission.

In accordance with another aspect of the present invention for achieving the above object, there is provided a partial pressure measuring apparatus includes: a local plasma source which is provided in a vacuum chamber and dedicated to partial pressure measuring; a window which is formed in a wall part of the vacuum chamber and through which the emission passes; and a measurement unit operable to measure a partial pressure distribution in the vacuum chamber, by (i) receiving, through the window, emission of plasma generated by the local plasma source and (ii) performing emission spectral analysis on intensity of the emission.

Accordingly, the present invention provides a partial pressure measuring method and a partial pressure measuring apparatus by which partial pressure distribution in a vacuum chamber can be easily measured.

By the partial pressure measuring method and partial pressure measuring apparatus, it is possible to use emission of plasma generated by a local plasma source dedicated to partial pressure measurement, not emission of plasma generated by a process plasma source used for processing. As a result, pressure distribution in the vacuum chamber can be easily measured. In addition, the processing apparatus having the partial pressure measuring apparatus according to the present invention can form a film homogeneously based on the pressure distribution in the vacuum chamber, without using complicated measurement equipments.

FURTHER INFORMATION ABOUT TECHNICAL BACKGROUND TO THIS APPLICATION

The disclosure of Japanese Patent Application No. 2007-108968 filed on Apr. 18, 2007 including specification, drawings and claims is incorporated herein by reference in its entirety.

BRIEF DESCRIPTION OF THE DRAWINGS

These and other objects, advantages and features of the present invention will become apparent from the following description thereof taken in conjunction with the accompanying drawings that illustrate specific embodiments of the present invention. In the Drawings.

DESCRIPTION OF THE PREFERRED EMBODIMENT(S)

The following describes embodiments of the present invention with reference to the drawings.

First Embodiment

Figure 2:
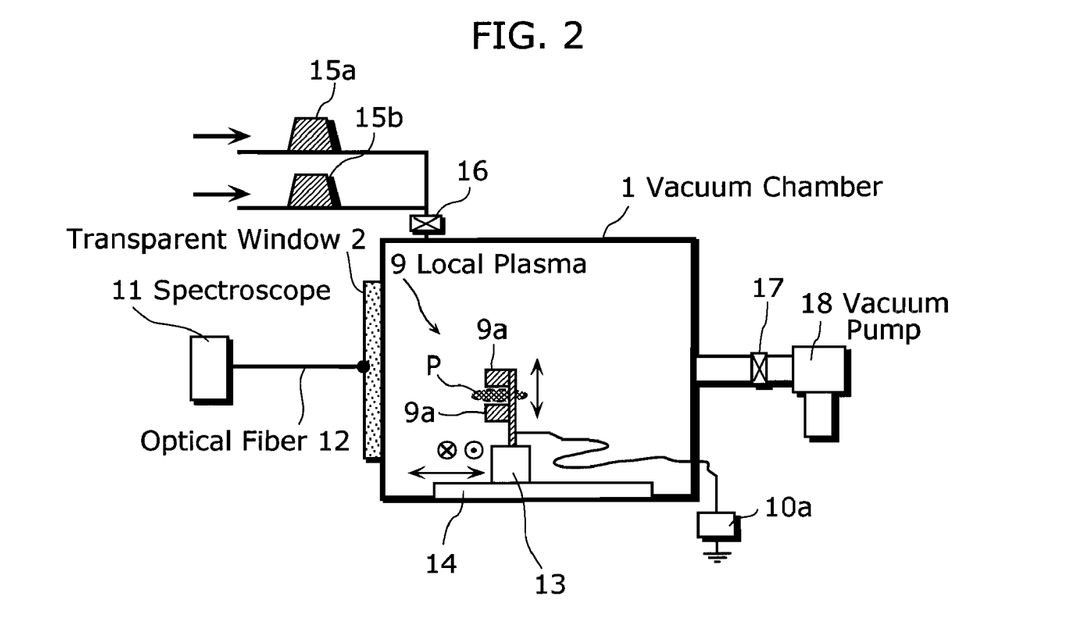
FIG. 2 is a block diagram of a partial pressure measuring apparatus according to the first embodiment of the present invention.

FIG. 2 is a block diagram of a partial pressure measuring apparatus according to the first embodiment of the present invention.

The partial pressure measuring apparatus of FIG. 2 includes: a vacuum chamber 1; a transparent window 2 through which light passes; a local plasma source 9; an electrode 9a for the local plasma source 9; a power source 10a for the local plasma source 9; a spectroscope 11; an optical fiber 12; an elevating device 13 for lifting and lowering the local plasma source 9; a mobile stage 14 for the local plasma source 9; mass flow controllers 15a and 15b; a gas introduction valve 16; a gas exhaust valve 17; and a vacuum pump 18.

Through the transparent window 2, emission of plasma generated by the local plasma source 9 passes.

The local plasma source 9 is a plasma source which is used only for partial pressure measurement (hereinafter, referred to also as "plasma source dedicated to partial pressure measurement"). The local plasma source 9 generates plasma P at a location, and the partial pressure measurement is performed on the generated plasma P.

Here, the local plasma source 9 can move to any positions on the mobile stage 14, and a height of the local plasma source 9 can be adjusted by the elevating device 13.

Figure 3:
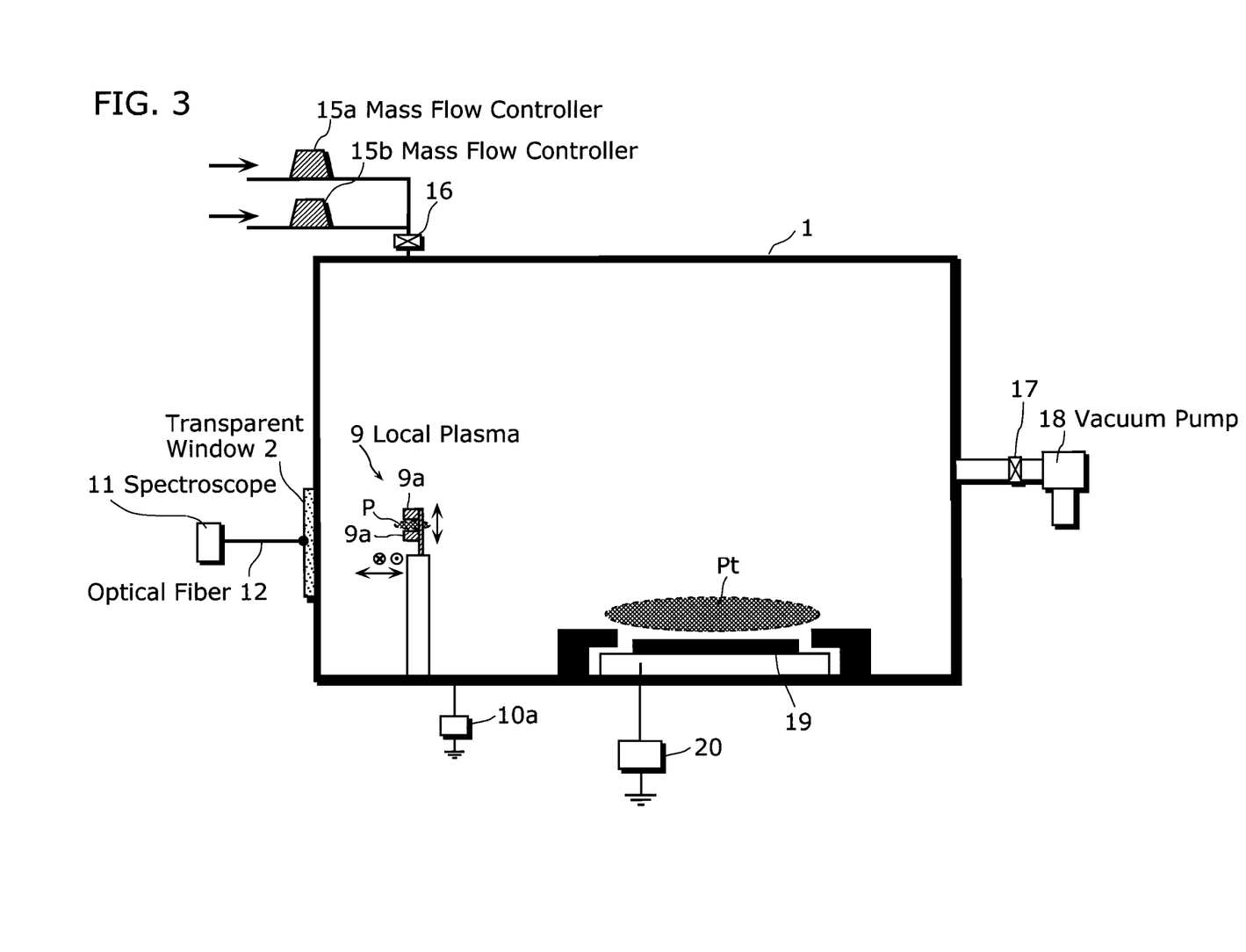
FIG. 3 is a diagram showing a local plasma source 9 as a plasma source dedicated to partial pressure measurement.

FIG. 3 is a diagram showing the local plasma source 9 as a plasma source dedicated to partial pressure measurement. In FIG. 3, a target 19 which generates plasma and a process plasma power source 20 which applies a voltage to the target 19 are further shown. Above the target 19, plasma Pt which is dedicated to processing, not to the partial pressure measuring (hereinafter, referred to also as "plasma used for processing") is generated.

As shown in FIG. 3, a dimension of the local plasma sources 9 is a local size in comparison with a dimension of the vacuum chamber 1. The dimension of the local plasma sources 9 is any size larger than 1 cm, for example. Such small local plasma source 9 does not affect gas flow introduced into the vacuum chamber 1.

The power source 10a supplies power to the electrode 9a. The power source 10a may be a direct current (DC) power source, a high frequency power source, a pulsed power source, frequency-variable alternate current (AC) power source, or the like.

The optical fiber 12 is an optical system which introduces light to the spectroscope 11. Although FIGS. 2 and 3 show the optical fiber, this does not necessary to be the optical fiber, as far as light to be measured can be introduced to the spectroscope 11 through the transparent window 2. Instead of the optical fiber, an optical element such as a lens or a prism can be used. It is preferable that the optical system for introducing light to the spectroscope 11 10 detects light near the transparent window 2, in order to achieve reliable detection sensitivity. It is also preferable that the optical fiber is highly flexible and not influenced by external light.

The inside of the vacuum chamber 1 is exhausted by the vacuum pump 18 connected to the vacuum chamber 1 via the gas exhaust valve 17. A small amount of gas is introduced into the vacuum chamber 1 through the mass flow controllers 15a and 15b.

It should be noted that the number of the mass flow controllers 15 (15a and 15b) is not limited, but any necessary number is possible.

It should also be noted that the gas for which the partial pressure measurement is to be performed may be the gas introduced by the mass flow controller 15 into the vacuum chamber 1, or residual gas discharged from a surface of an internal wall of the vacuum chamber 1. In this case, rare gas such as argon (Ar) gas is introduced into the vacuum chamber to keep plasma discharge.

The following describes the partial pressure measuring method in the case where Ar gas and oxygen gas are introduced into the vacuum chamber 1 by the mass flow controllers 15a and 15b, according to the first embodiment of the present invention.

Firstly, while closing the gas introduction valve 16, the inside of the vacuum chamber 1 is exhausted to be high vacuum using the vacuum pump 18.

Next, when the inside of the vacuum chamber 1 becomes high vacuum of about $1.0\,e^{-4}$ Pa, the gas introduction valve 16 is opened to introduce gas.

Here, the mass flow controller 15a is used to introduce Ar gas, and the mass flow controller 15b is used to introduce oxygen gas. For example, a flow volume of the Ar gas is set to 60 sccm, and a flow volume of the oxygen gas is set to 40 sccm.

Here, a pressure in the vacuum chamber 1 varies depending on conditions such as an exhaust capability of the vacuum pump 18 or an open degree of the gas exhaust valve 17. In order to keep plasma discharge, it is required to adjust the pressure to be in a range from about 0.1 Pa to about several dozen Pa.

Figure 4:
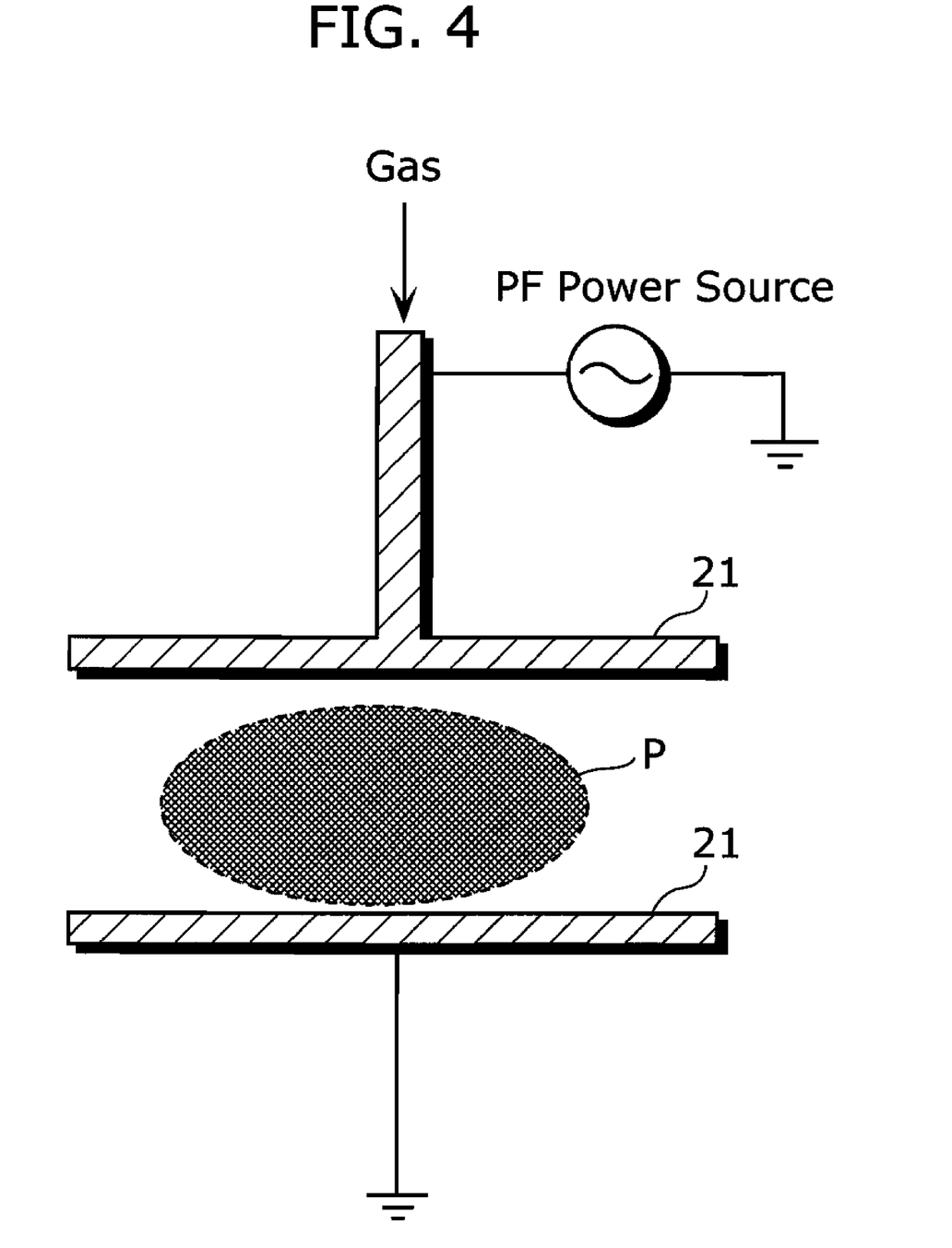
FIG. 4 is a perspective view of a applicable local plasma source according to the first embodiment of the present invention.
Figure 5:
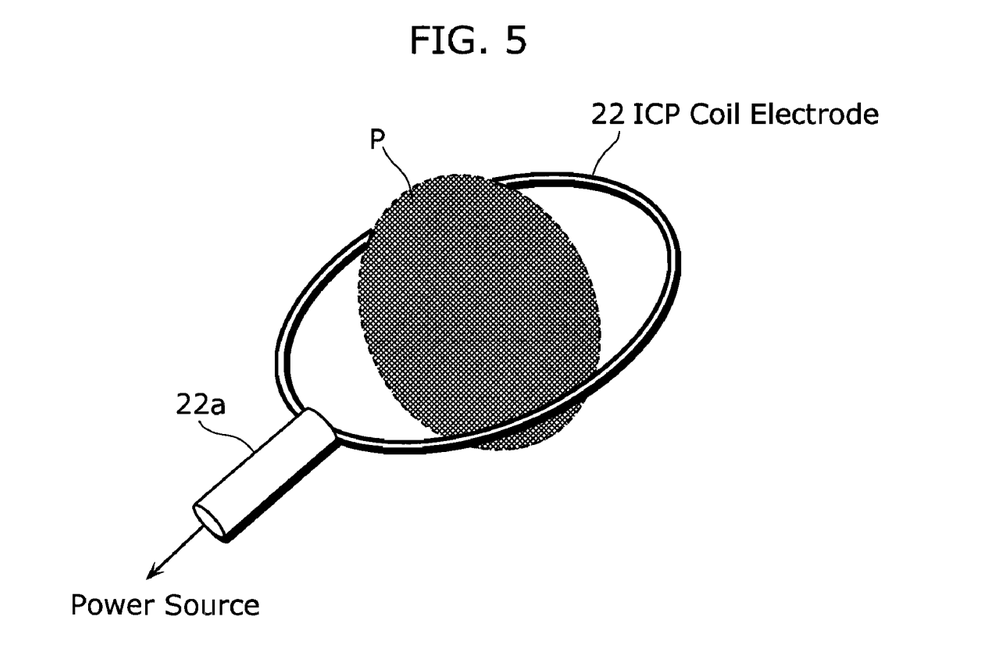
FIG. 5 is a perspective view of another applicable local plasma source according to the first embodiment of the present invention.
Figure 6:
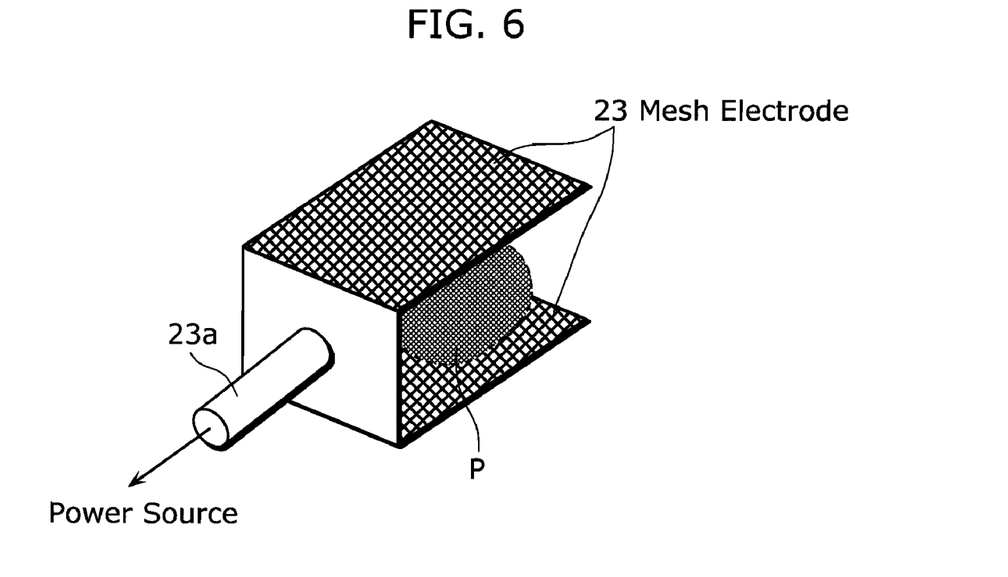
FIG. 6 is a perspective view of still another applicable local plasma source according to the first embodiment of the present invention.

Each of FIGS. 4, 5, and 6 is a perspective view of a local plasma source applicable in the first embodiment of the present invention.

As shown in FIG. 4, as the electrode 9a for the local plasma source 9, parallel plate electrodes 21 which are metal boards facing each other and each having a diameter of about 30 mm can be used to generate plasma. Emission spectral analysis can be performed on emission of plasma P generated by the parallel plate electrodes 21 of FIG. 4. A size of the electrode is not specifically limited, but preferably the size is small enough to scan the inside of the vacuum chamber 1 and perform local partial pressure measurement. The parallel plate electrodes 21 are arranged in parallel, so that the parallel plate electrodes 21 can be adjusted not to disturb gas flow in the vacuum chamber 1.

It should be noted that the electrode 9a of the local plasma source 9 is not limited to such parallel plate electrodes. It should also be noted that a voltage supplied from the power source 10 to the electrode 9a may be a DC voltage, a high frequency voltage, a pulsed voltage, or a superimposed voltage of these voltages. For example, since a high frequency voltage easily keeps discharge in principal, so that a rod-shaped antenna or an Inductively Coupled Plasma (ICP) coil electrode 22 shown in FIG. 5 can be used as the electrode 9a of the local plasma source 9 (generation source of the plasma P).

In FIG. 5, a reference numeral 22a denotes a power supply cable. The ICP coil electrode 22 of FIG. 5 has a small cross-sectional area, so that the ICP coil electrode 22 hardly blocks the gas flow in the vacuum chamber 1. Thereby, the partial pressure measurement can be performed at higher accuracy.

It should also be noted that a mesh opposite electrode 23 shown in FIG. 6 may be used as the electrode 9a of the local plasma source 9, providing the same advantages as described above. The mesh opposite electrode 23 has mesh-shaped spacing, which makes it possible to perform the partial pressure measurement even in DC discharge without disturbing gas flow.

In FIG. 6, a reference numeral 23a denotes a power supply cable.

It should be noted that, as the electrode 9a of the local plasma source 9, a hollow cathode electrode or a punching metal electrode may be used.

Now, back to the description for the partial pressure measuring method according to the first embodiment, as shown in FIG. 1, the power source 10a for the local plasma source 9 supplies a high voltage to the electrode 9a of the local plasma source 9, thereby generating the plasma P between the electrodes 9a.

Each of gaseous species in the vacuum chamber 1 is excited by energy of the plasma P. Therefore, emission having a wavelength unique to each of the gaseous species can be observed. For example, an emission line from Ar has emission line having a wavelength of 697 nm, and an emission line from oxygen has emission line having a wavelength of 777 nm.

Next, the local plasma source 9 is moved to a position at which the partial pressure measurement is to be performed, using the elevating device 13 and the mobile stage 14 as means for moving the local plasma source 9.

Next, emission of the plasma P generated by the local plasma source 9 at the moved position is introduced by the optical fiber 12 to the spectroscope 11 through the transparent window 2. The spectroscope 11 performs emission spectral analysis on the emission introduced by the optical fiber 12, thereby measuring emission intensity distribution in the vacuum chamber 1.

Here, if besides the local plasma source 9 dedicated to the partial pressure measurement there is any other process plasma source used for processing, it is desirable to set a direction of arranging the parallel plate electrodes of the local plasma source 9 so that the plasma P generated by the local plasma source 9 cannot see directly from the process plasma source. In other words, the direction of arranging the parallel plate electrodes of the local plasma source 9 is set, so that the optical fiber 12 can introduce only the emission of the plasma P generated by the local plasma source 9.

It is preferable that the local plasma source 9 is provided so that the plasma P generated by the local plasma source 9 cannot see directly from the process plasma source, not only in the case of the parallel plate electrodes 21, but also in the case of the ICP coil electrode 22, the mesh opposite electrode 23, a hollow cathode electrode, or a punching metal electrode.

Also, when the local plasma source 9 is moved, it is preferable that the local plasma source 9 cannot see directly from the process plasma source. It is further preferable to have a means for adjusting an angle of the local plasma source 9.

Moreover, the partial pressure distribution of oxygen can be measured by the partial pressure measuring method according to the first embodiment, by plotting a ratio of emission intensity from oxygen gas having a wavelength of 777 nm. Furthermore, the partial pressure distribution of oxygen can be measured at high accuracy, by plotting a ratio of (i) the emission intensity from Ar gas having a wavelength of 697 nm (ii) to the emission intensity from oxygen gas having a wavelength of 777 nm. Such tracer gas is preferably rare gas, such as Ar gas, which is hardly reacted with a wall surface and the like. By plotting such a ratio of emission intensity of tracer gases, it is possible to prevent that accuracy of the partial pressure measurement is reduced duet to variations of a discharge state when discharge occurs at each location in the vacuum chamber 1.

It should be noted that the partial pressure measuring method in the case of mix gas of Ar gas and oxygen gas has been described in the first embodiment, but used gas is not limited to these gases. For example, the oxygen gas can be replaced by any gas of element to be measured, such as nitrogen gas, $H_2O$, or hydrogen gas. A wavelength of emission line from each element is known. For example, hydrogen gas has emission line having a wavelength of 656 nm.

Accordingly, in the partial pressure measuring method according to the first embodiment, by using plasma emission generated by the local plasma source 9 dedicated to the partial pressure measuring, not using plasma emission generated by the process plasma source. Thereby, it is possible to easily measure the pressure distribution in the vacuum chamber 1. Furthermore, in the partial pressure measuring method according to the first embodiment, the electrode 9a of the local plasma source 9 is the parallel plate electrode 21, an ICP coil electrode 22, or the mesh opposite electrode 23. Thereby, the partial pressure measuring can be performed at high accuracy without disturbing gas flow in the vacuum chamber 1.

Still further, the local plasma source 9 can be moved. Thereby, it is possible to perform the partial pressure measuring for a local region at an arbitrary position.

Second Embodiment

Figure 7:
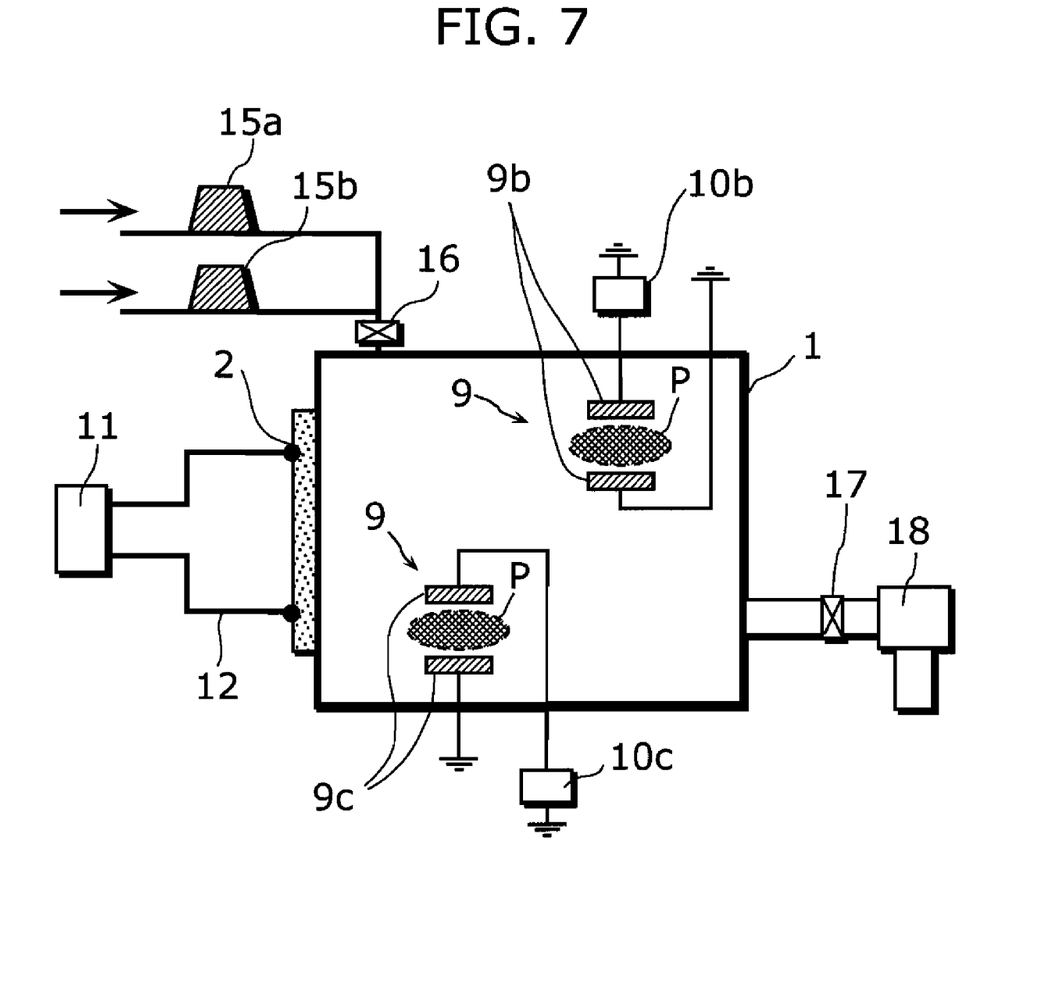
FIG. 7 is a block diagram of a partial pressure measuring apparatus according to the second embodiment of the present invention.

FIG. 7 is a block diagram of a partial pressure measuring apparatus according to the second embodiment of the present invention. Here, the same reference numerals of FIG. 2 of the first embodiment are assigned to the identical elements of FIG. 7, so that the identical elements are not explained again below.

The second embodiment differs from the first embodiment that the local plasma sources 9 are provided at plurality of locations at each of which the partial pressure measurement is to be performed. FIG. 7 shows two sets of the parallel plate electrodes, as an electrode 9b and an electrode 9c of the local plasma source 9.

A power source 10b for the local plasma source 9 supplies a high pressure to the electrode 9b, and a power source 10c for the local plasma source 9 supplies a high pressure to the electrode 9c, thereby generating plasma P, respectively. Regarding this discharge for generation of the plasma P, all of the local plasma sources 9 may be operated together, or may be switched to cause discharge at only selected measuring location.

Like in FIG. 2 of the first embodiment, in FIG. 7, in order to introduce emission into the spectroscope 11, emission of plasma P at a measurement location is measured through the transparent window, using an optical system such as the optical fiber 12 or a lens.

It should be noted that the electrode 9b and the electrode 9c of the local plasma source 9 are not limited to the parallel plate electrodes, but may be, as described in the first embodiment, hollow cathode electrodes, punching metal electrodes, ICP coil electrodes, or mesh opposite electrodes. It should also be noted that the voltage applied to the electrode 9b and the electrode 9c of the local plasma source 9 may be a DC voltage, a high frequency voltage, a pulsed voltage, or a superimposed voltage of these voltages.

Accordingly, in the second embodiment, a plurality of the local plasma sources 9 are provided in respective appropriate locations in the vacuum chamber 1. Thereby, a function of elevating or moving the local plasma sources 9 is not necessary. As a result, the second embodiment has advantages of reducing bad influence to the process plasma sources, a problem of cleanliness decrease in the vacuum chamber 1, or the like, in comparison with the first embodiment.

Third Embodiment

Figure 8:
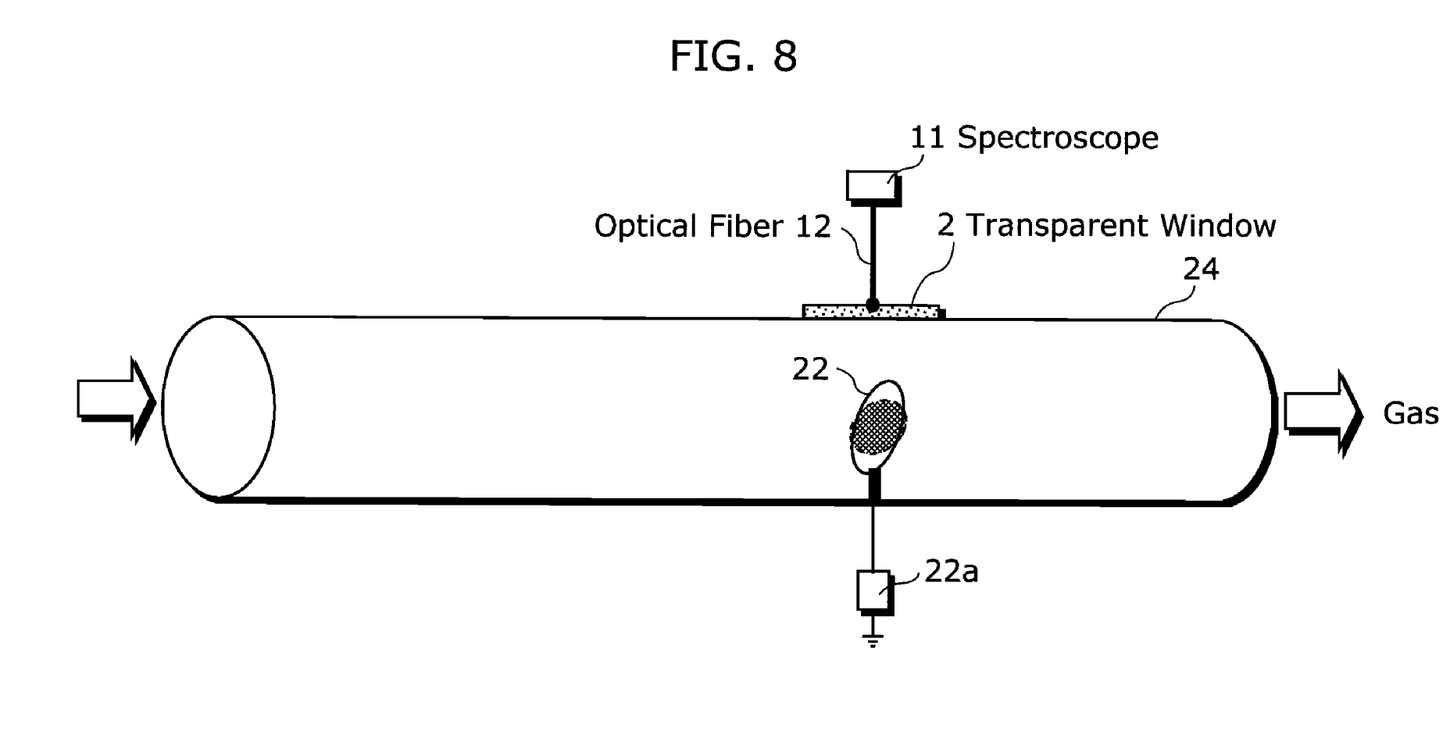
FIG. 8 is a block diagram of a partial pressure measuring apparatus according to the third embodiment of the present invention.

FIG. 8 is a block diagram of a partial pressure measuring apparatus according to the third embodiment of the present invention.

FIG. 8 shows that the partial pressure measuring apparatus according to the third embodiment performs partial pressure measurement on gas in a pipe 24 which is used to introduce the gas into the vacuum chamber 1 or exhaust the gas from the vacuum chamber 1, for example. Here, the same reference numerals of FIG. 2 of the first embodiment are assigned to the identical elements of FIG. 8, so that the identical elements are not explained again below.

As shown in FIG. 8, the transparent window 2 is arranged in an external wall of the pipe 24 corresponding to a location for which partial pressure measurement is to be performed (partial pressure measurement location). Emission of plasma generated by the local plasma source 9 passes through the transparent window 2, and is introduced by the optical fiber 12 to the spectroscope 11. The spectroscope 11 performs partial pressure measurement on the introduced emission.

Here, an electrode of the local plasma source 9 is an ICP coil electrode 22, as one example. The local plasma source 9 is small enough to be provided in the pipe 24.

As described above, in the third embodiment, since the local plasma source 9 is small enough to be provided even in the pipe 24. By providing the local plasma source 9 in an appropriate location in the pipe 24, it is possible to perform the partial pressure measurement at high accuracy, without blocking gas flow in the pipe 24.

Fourth Embodiment

Figure 9:
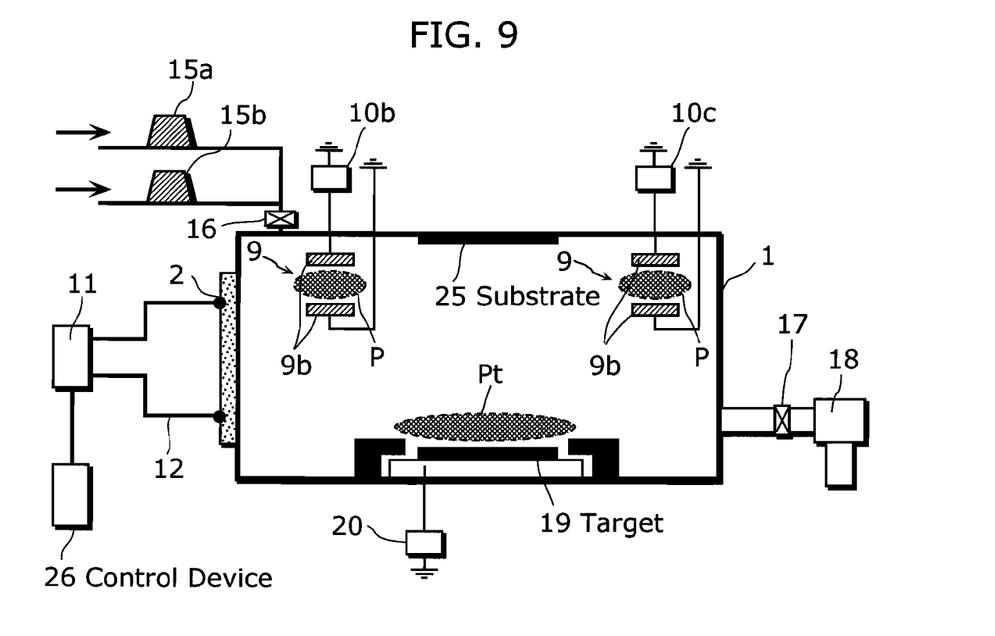
FIG. 9 is a block diagram of a partial pressure measuring apparatus in a sputtering apparatus according to the fourth embodiment of the present invention.

FIG. 9 is a block diagram of a partial pressure measuring apparatus in a sputtering apparatus according to the fourth embodiment of the present invention. Here, the same reference numerals of FIGS. 2 and 7 of the first and second embodiments are lo assigned to the identical elements of FIG. 9, so that the identical elements are not explained again below. In the fourth embodiment, reactive sputtering for forming a $SiO_2$ film using a Si target is described as one example.

The sputtering apparatus shown in FIG. 9 includes: the vacuum chamber 1; the transparent window 2; a plurality of the local plasma sources 9; the electrodes 9b and 9c for the local plasma source 9; the power sources 10b and 10c for the local plasma source 9; the spectroscope 11; the optical fiber 12; the mass flow controllers 15a and 15b; the gas introduction valve 16; the gas exhaust valve 17; and the vacuum pump 18. In addition, the sputtering apparatus includes the target 19, a substrate 25 which is to be processed, the process plasma power source 20 of a high voltage, and a control device 26.

In the sputtering apparatus of FIG. 9, the process plasma power source 20 supplies a voltage to the target 19 in order to generates plasma Pt used for processing, in front of the target 19.

Then, trough the transparent window 2, the spectroscope 11 receives emission of plasma P generated by each of the local plasma sources 9, and then performs partial pressure measurement on the received emission. The spectroscope 11 generates an emission signal regarding the measured emission.

Based on the emission signal generated by the spectroscope 11, the control device 26 adjusts at least one of a gas flow volume, a gas mix ratio, a target application power, a pressure control valve opening degree, so that distribution of intensity of the emission (emission intensity distribution) becomes more homogeneous in the vacuum chamber 1.

Next, an embodiment of the sputtering apparatus is described. The following describes the case where Ar gas and oxygen gas are introduced into the vacuum chamber 1 by the mass flow controllers 15a and 15b.

Firstly, while closing the gas introduction valve 16, the inside of the vacuum chamber 1 is exhausted to be high vacuum, using the vacuum pump 18.

Next, when the inside of the vacuum chamber 1 becomes high vacuum of about $1.0\,e^{-4}$Pa, the gas introduction valve 16 is opened to introduce gas.

Here, the mass flow controller 15a is used to introduce Ar gas, and the mass flow controller 15b is used to introduce oxygen gas.

Next, oxygen gas having a flow volume enough to oxidize Si is introduced into the vacuum chamber 1. The mass flow controller 15a is adjusted so that a total pressure in the vacuum chamber 1 becomes 0.2 Pa, for example, by a flow volume of Ar gas.

Next, the process plasma power source 20 supplies power to the target 19 to cause plasma discharge used for processing. Thereby, ions in the plasma Pt have collision against the target 19 at a high speed. Until reaching the substrate 25, Si atoms sputtered from the target 19 are combined with oxygen to be $SiO_2$. Then, the $SiO_2$ are deposited on the substrate 25.

Here, especially oxygen gas surrounding the substrate 25 is consumed as Si atoms are oxidized. Thereby, in some balance between a path supplying the Si atoms from the target 19 to the substrate 25 and a consuming state of the Si atoms, an abundance of the Si atoms (or $SiO_2$) sometimes has spatial distribution. In order to form a $SiO_2$ film homogeneously on the substrate 25, variations of oxygen abundance is to be reduced as much as possible. Therefore, it is crucial to know oxygen partial pressure distribution in the vacuum chamber 1.

In the fourth embodiment, the local plasma sources 9 dedicated to the partial pressure measurement are provided in the vacuum chamber 1 of the sputtering apparatus, in order to measure partial pressure of oxygen. Then, based on the information of the oxygen partial pressure measurement distribution, a gas flow volume or a pressure control valve opening degree, for example, is adjusted.

As described above, the sputtering apparatus according to the fourth embodiment deposits a thin film homogeneously on the substrate 25.

Accordingly, in the fourth embodiment, by having the local plasma sources 9, partial pressure distribution of oxygen can be measured as described above. Thereby, it is possible to generate a film homogeneously, by adjusting a gas flow volume or a pressure control valve opening degree, for example, based on the information of the oxygen partial pressure measurement distribution.

It should be noted that electrodes of each of the local plasma sources 9 is not limited to the parallel plate electrodes. The local plasma source 9 may have an ICP coil electrode, a mesh opposite electrode, a hollow cathode electrode, or a punching metal electrode. It should also be noted that, besides the above methods by having a plurality of the local plasma sources 9, it is also possible to achieve the same advantages as previously described, when a single local plasma source 9 is elevated in the vacuum chamber 1 to measure the partial pressure distribution.

It should also be noted that it has been described in the fourth embodiment that the local plasma sources 9 dedicated to the partial pressure measurement are provided in the vacuum chamber 1 of the sputtering apparatus in order to measure partial pressure distribution of gas, however, the fourth embodiment is not limited to the sputtering apparatus. For example, the apparatus of the fourth embodiment may be a processing apparatus (manufacturing apparatus) which is used to process semiconductor manufacture or the like and requires gas partial pressure distribution measurement, for example.

Fifth Embodiment

Figure 10:
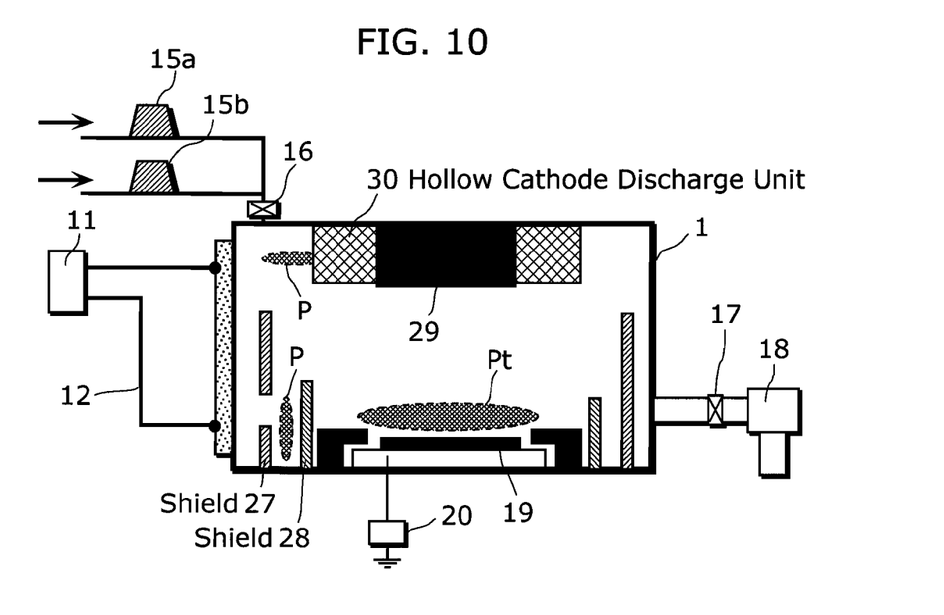
FIG. 10 is a block diagram of a partial pressure measuring apparatus in a sputtering apparatus according to the fifth embodiment of the present invention.

FIG. 10 is a block diagram of a partial pressure measuring apparatus in a sputtering apparatus according to the fifth embodiment of the present invention. Here, the same reference numerals of FIGS. 2, 7, and 9 of the first to third embodiments are assigned to the identical elements of FIG. 10, so that the identical elements are not explained again below. In the fifth embodiment, reactive sputtering for forming a $SiO_2$ film using a Si target is described as one example. In the fifth embodiment, the local plasma source has a structure which does not need the power source.

The sputtering apparatus of FIG. 10 includes: the vacuum chamber 1; the transparent window 2; the spectroscope 11; the optical fiber 12; the mass flow controllers 15a and 15b; the gas introduction valve 16; the gas exhaust valve 17; and the vacuum pump 18. In addition, the sputtering apparatus includes the target 19, the process plasma power source 20 of a high voltage, shields 27 and 28, a substrate 29 which is to be processed, and a hollow cathode discharge unit 30.

If a voltage supplied to the target 19 is (i) high frequency wave, (ii) a pulsed voltage, (iii) a superimposed voltage of a DC and the high frequency wave, or (iv) a superimposed voltage of a DC and the pulsed voltage, electric charges accumulated on a surface of an external wall of the vacuum chamber 1 are released periodically as the voltage vibrates. In a region in the vacuum chamber from which electric charges are released, a hole of several mm to several dozens mm in diameter is formed, or a member of a shape of a combination of substantially parallel metal boards is formed. Thereby, glow discharge occurs at the hole or the member.

FIG. 10 shows that the hollow cathode discharge unit 30 and a pair of the shields 27 and 28 corresponding to the hollow cathode discharge unit 30 are formed. Electrons flown from plasma Pt generated in front of the target 19 is directed to wall surfaces of the vacuum chamber 1. With increase of the number of film forming processing, regions, which do not function as anodes since the wall surfaces of the vacuum chamber 1 are covered with $SiO_2$, are increased. Therefore, the electrons flown from the plasma Pt gradually flow to anodes far from the target 19.

In the meanwhile, among the shields 27 and 28, regarding the shield 27 positioned outside of the target 19, on a surface facing the target 19, $SiO_2$ are adhered causing charging. On the other hand, among the shields 27 and 28, regarding the shield 28 positioned inside of the target 19, on a surface not facing the target 19, a film is hardly adhered relatively. Thereby, the earth potential is kept there. Thereby, as the film forming is progressed, between the shield 27 and the shield 28 there is naturally generated a region in which a dielectric surface faces an earth surface.

In general, after replacement of the shield 27 and the shield 28 for maintenance, the above-described dielectric film is formed during initial aging. Therefore, additional processing for forming the dielectric surface is not necessary.

Here, a distance between the shield 27 and the shield 28 is set to be in a range from 10 mm to 50 mm, for example, so that the glow discharge can be kept as a pulsed voltage vibrates. Emission of the plasma P generated by the glow discharge passes through the transparent window 2 and is received and measured by the spectroscope 11. Thereby, it is possible to know the partial pressure. Therefore, the shield 27 and the shield 28 can be used as the local plasma source 9. Furthermore, as described above, the shield 27 and the shield 28 can cause the glow discharge without any dedicated power source.

Still further, for more convenience, like the hollow cathode discharge unit 30, on a wall surface of the shield 27 and the shield 28, a hole of several mm to several dozens mm in diameter may be formed to induce hollow cathode discharge.

As described above, in the fifth embodiment, a specific power source dedicated to the local plasma source is not necessary, and a very small and inexpensive local plasma source can be realized. As a result, the fifth embodiment has advantages of improving maintenance and realizing high productivity.

The sputtering method and the sputtering apparatus using the partial pressure measuring method and the partial pressure measuring apparatus according to the present invention can realize partial pressure distribution measurement performed in a vacuum chamber at low cost and easily. Furthermore, the sputtering apparatus and the sputtering apparatus can perform feedback control based on the result of the partial pressure distribution measurement, and form a film homogeneously.

It should be noted that, when the local plasma source 9 has a punching metal electrode, a punching metal of the punching metal electrode may have a single small hole enough to cause glow discharge.

As described above, in the partial pressure measuring method and the partial pressure measuring apparatus according to the present invention, it is possible to easily measure pressure distribution in a vacuum chamber, by using emission of plasma generated by a local plasma source dedicated to the partial pressure measurement, not emission of plasma generated by a process plasma source used for processing. As a result, the present invention provides a partial pressure measuring method and a partial pressure measuring apparatus by which partial pressure distribution in a vacuum chamber can be easily measured.

Although only some exemplary embodiments of the present invention have been described in detail above, those skilled in the art will be readily appreciate that many modifications are possible in the exemplary embodiments without materially departing from the novel teachings and advantages of the present invention. Accordingly, all such modifications are intended to be included within the scope of this invention.

INDUSTRIAL APPLICABILITY

The present invention can be used as a partial pressure measuring method and a partial pressure measuring apparatus. Especially, the present invention can be used as a partial pressure measuring method and a partial pressure measuring apparatus used in a vacuum apparatus, an optical component, a processing apparatus or a sputtering apparatus.

What is claimed is:

1. A partial pressure measuring method comprising:
   moving a local plasma source to a location at which partial pressure is to be measured, the local plasma source being provided in a vacuum chamber and dedicated to the partial pressure measuring; and
   measuring a partial pressure distribution in the vacuum chamber, by (i) receiving, through a window, emission of plasma generated by the local plasma source and (ii) performing emission spectral analysis on intensity of the emission, the window being provided in a wall part of the vacuum chamber and through the window the emission passing.

2. The partial pressure measuring method according to claim 1,
   wherein the local plasma source has an electrode which is one of a DC parallel plate electrode, a high-frequency parallel plate electrode, an inductively coupled plasma coil electrode, and a mesh opposite electrode.

3. The partial pressure measuring method according to claim 2,
   wherein said partial pressure measuring method is performed in the vacuum chamber in a processing apparatus which includes in the vacuum chamber: a process plasma source used for processing performed in the processing apparatus; and a substrate which is to be processed in the processing apparatus, and
   said partial pressure measuring method further comprises performing adjustment based on the partial pressure distribution measured in said measuring, so that a distribution of the intensity of the emission regarding each of said plurality of local plasma sources becomes homogeneous in the vacuum chamber,
   wherein said adjusting includes physically forming a thin film on the substrate, by using another plasma generated by applying a high voltage to the process plasma source.

4. The partial pressure measuring method according to claim 3,
   wherein the processing apparatus is a sputtering apparatus which has a target as a plasma source in the vacuum chamber and forms a thin film on the substrate by using another plasma generated by applying a high voltage to the target, and in said adjusting, at least one of a gas flow volume, a gas mix ratio, a target application power, and a pressure control valve opening degree is adjusted based on the partial pressure distribution measured in said measuring, so that a distribution of the intensity of the emission becomes homogeneous in the vacuum chamber.

5. The partial pressure measuring method according to claim 1,
wherein the local plasma source has: a surface which is substantively in a floating state; and a metal surface facing the surface.

6. A partial pressure measuring method comprising
measuring a partial pressure distribution at plurality of locations in a vacuum chamber, by (i) receiving, through a window, emission of plasma generated by each of a plurality of local plasma sources in the vacuum chamber and (ii) performing emission spectral analysis on intensity of the emission regarding each of said plurality of local plasma sources, the window being provided in a wall part of the vacuum chamber and through the window the emission passing.

7. The partial pressure measuring method according to claim 6,
wherein the local plasma source has an electrode which is one of a DC parallel plate electrode, a high-frequency parallel plate electrode, an inductively coupled plasma coil electrode, and a mesh opposite electrode.

8. The partial pressure measuring method according to claim 6,
wherein the local plasma source has: a surface which is substantively in a floating state; and a metal surface facing the surface.

9. A partial pressure measuring apparatus comprising:
a local plasma source which is provided in a vacuum chamber and dedicated to partial pressure measuring;
a moving unit operable to move the local plasma source to a location at which the partial pressure is to be measured;
a window which is formed in a wall part of the vacuum chamber and through which the emission passes; and
a measurement unit operable to measure a partial pressure distribution in the vacuum chamber, by (i) receiving, through the window, emission of plasma generated by the local plasma source and (ii) performing emission spectral analysis on intensity of the emission.

10. The partial pressure measuring apparatus according to claim 9,
wherein said local plasma source has an electrode which is one of a DC parallel plate electrode, a high-frequency parallel plate electrode, an inductively coupled plasma coil electrode, and a mesh opposite electrode.

11. The partial pressure measuring apparatus according to claim 10,
wherein said partial pressure measuring apparatus is included in a processing apparatus which has in the vacuum chamber: a process plasma source used for processing performed in the processing apparatus; and a substrate which is to be processed in the processing apparatus,
the manufacturing apparatus performs adjustment based on the partial pressure distribution measured by said measuring unit, so that a distribution of the intensity of the emission becomes homogeneous in the vacuum chamber, and
forms physically a thin film on the substrate, by using another plasma generated by applying a high voltage to said process plasma source.

12. The partial pressure measuring apparatus according to claim 9,
wherein said local plasma source has: a surface which is substantively in a floating state; and a metal surface facing the surface.

13. The partial pressure measuring apparatus according to claim 11,
wherein the processing apparatus
is a sputtering apparatus which has a target as a plasma source in the vacuum chamber and forms a thin film on the substrate by using another plasma generated by applying a high voltage to the target, and
adjusts at least one of a gas flow volume, a gas mix ratio, a target application power, and a pressure control valve opening degree, based on the partial pressure distribution measured by said measurement unit, so that a distribution of the intensity of the emission becomes homogeneous in the vacuum chamber.

14. A partial pressure measuring apparatus comprising:
a plurality of local plasma sources which are provided in a vacuum chamber and dedicated to partial pressure measuring;
a window which is formed in a wall part of the vacuum chamber and through which the emission passes; and
a measurement unit operable to measure a partial pressure distribution in the vacuum chamber, by (i) receiving, through the window, emission of plasma generated by each of the plurality of local plasma sources and (ii) performing emission spectral analysis on intensity of the emission regarding each of said plurality of local plasma sources.

15. The partial pressure measuring apparatus according to claim 14,
wherein said local plasma source has an electrode which is one of a DC parallel plate electrode, a high-frequency parallel plate electrode, an inductively coupled plasma coil electrode, and a mesh opposite electrode.

16. The partial pressure measuring apparatus according to claim 14,
wherein said local plasma source has: a surface which is substantively in a floating state; and a metal surface facing the surface.

* * * * *